US008861406B2

(12) United States Patent
Han

(10) Patent No.: US 8,861,406 B2
(45) Date of Patent: Oct. 14, 2014

(54) TRANSMITTER APPARATUS OF MOBILE DEVICE AND OPERATION METHOD THEREOF

(75) Inventor: Kyu Sung Han, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 595 days.

(21) Appl. No.: 13/092,773

(22) Filed: Apr. 22, 2011

(65) Prior Publication Data

US 2011/0261727 A1  Oct. 27, 2011

(30) Foreign Application Priority Data

Apr. 22, 2010  (KR) .................. 10-2010-0037400

(51) Int. Cl.
*H04B 7/00* (2006.01)
*H04B 1/00* (2006.01)
*H04B 1/52* (2006.01)

(52) U.S. Cl.
CPC . *H04B 1/006* (2013.01); *H04B 1/52* (2013.01)
USPC ....................................................... 370/277

(58) Field of Classification Search
CPC .......... H04B 1/52; H04B 1/006; H04B 1/005; H04B 1/0053; H04B 1/0067
USPC .................... 370/277, 280; 455/333; 375/219
See application file for complete search history.

(56) References Cited

U.S. PATENT DOCUMENTS

| | | | |
|---|---|---|---|
| 2005/0143024 A1* | 6/2005 | Sung et al. .................... | 455/101 |
| 2011/0006841 A1* | 1/2011 | Wyse et al. ................ | 330/124 R |
| 2011/0088028 A1* | 4/2011 | Tofighbakhsh et al. ....... | 717/178 |
| 2011/0117862 A1* | 5/2011 | Bagger et al. ................... | 455/77 |

* cited by examiner

*Primary Examiner* — Pao Sinkantarakorn
*Assistant Examiner* — Richard Chang

(57) ABSTRACT

In a transmitter apparatus of a mobile device, a radio frequency unit has transmitting terminals for sending wireless signals of different frequency bands. Transmission filters are respectively connected to the transmitting terminals and perform a filtering process for the signal of each frequency band. A first switch has a single output terminal and input terminals respectively connected to the transmission filters, performing a switching operation to connect one of the input terminals and the output terminal in response to a control signal. A power amplifier amplifies the signal transmitted through the output terminal of the first switch. A second switch has a single input terminal connected to the power amplifier, and output terminals corresponding to the transmission filters. The second switch performs a switching operation to connect the input terminal and one of the output terminals in response to the control signal.

15 Claims, 3 Drawing Sheets

US 8,861,406 B2

TRANSMITTER APPARATUS OF MOBILE DEVICE AND OPERATION METHOD THEREOF

CROSS-REFERENCE TO RELATED APPLICATION(S) AND CLAIM OF PRIORITY

The present application is related to and claims the benefit under 35 U S.C. §119 a of a Korean patent application filed in the Korean Intellectual Property Office on Apr. 22, 2010 and assigned Serial No. 10-2010-0037400, and the entire disclosure of which is hereby incorporated by reference.

TECHNICAL FIELD OF THE INVENTION

The present invention relates in general to a mobile device and, more particularly, to a transmitter apparatus with a single power amplifier in the mobile device for supporting two or more frequency bands and also to an operation method thereof.

BACKGROUND OF THE INVENTION

Normally a mobile device refers to a kind of electronic device based on mobility and portability. With remarkable growth of related technologies, a great variety of mobile devices are increasingly popular. A mobile device may now offer a variety of end-user functions, in addition to a traditional voice call function, such as a short message service (SMS), a digital camera, a music player, a digital broadcast service, an e-mail service, an instant messenger service, and the like.

As market demands for various multimedia services of high quality increase, a new mobile device may support a high-speed data communication service. For instance, mobile devices that support LTE (Long Term Evolution) services are gradually increasing. These LTE services are offered using a number of different frequency bands.

In order to support such LTE services, a conventional mobile device should support multiple bands. Therefore, such a mobile device may include a plurality of transmitter apparatuses each of which corresponds to each frequency band. Each transmitter apparatus includes a transmission/reception (TX/RX) isolation unit, a power amplifier, a transmission filter, and the like, suitable for a corresponding specific frequency band. Since different transmitter apparatuses are used for different frequency bands, a conventional mobile device may often confront a shortage of space for accommodating components. Additionally, too many components may cause complicated circuitry of transmitter apparatuses and an increase of production costs.

SUMMARY OF THE INVENTION

To address the above-discussed deficiencies of the prior art, it is a primary object to minimize the number of power amplifiers used for a transmitter apparatus of a mobile device that supports two or more frequency bands.

According to one aspect of the present invention, a transmitter apparatus of a mobile device is provided. The transmitter apparatus includes a radio frequency (RF) unit having at least two transmitting terminals configured to send wireless signals of different frequency bands. The transmitter apparatus also includes at least two transmission filters each being connected to each of the transmitting terminals of the RF unit and configured to perform a filtering process for the wireless signal of each frequency band. The transmitter apparatus further includes a first switch having at least two input terminals and a single output terminal, each input terminal being connected to each transmission filter, the first switch configured to perform a switching operation to connect one of the input terminals and the output terminal in response to a control signal. The transmitter apparatus also includes a power amplifier configured to amplify the wireless signal transmitted through the output terminal of the first switch. The transmitter apparatus further includes a second switch having a single input terminal and at least two output terminals, the input terminal being connected to the power amplifier, each output terminal corresponding to each transmission filter, the second switch configured to perform a switching operation to connect the input terminal and one of the output terminals in response to the control signal. The transmitter apparatus further includes at least two duplexers each being connected to each of the output terminals of the second switch. The transmitter apparatus also includes an antenna configured to transmit the wireless signal outputted through one of the duplexers, and a control unit configured to generate the control signal.

According to another aspect of the present invention, a method for operating a transmitter apparatus of a mobile device is provided. The mobile device includes a first switch having a single output terminal and at least two input terminals connected respectively to at least two transmission filters, a second switch having a single input terminal and at least two output terminals connected respectively to at least two duplexers, and disposed between the output terminal of the first switch and the input terminal of the second switch. The method includes controlling a switching operation of the first switch such that the power amplifier is connected to the transmission filter selected corresponding to a specific frequency band. The method also includes controlling a switching operation of the second switch such that the power amplifier is connected to the duplexer selected corresponding to the specific frequency band.

According to other aspect of the present invention, a mobile device is provided. The mobile device includes a display unit. The mobile device also includes an input unit and a transmitter unit. The transmitter unit includes a radio frequency (RF) unit having at least two transmitting terminals configured to send wireless signals of different frequency bands. The transmitter unit also includes at least two transmission filters each being connected to each of the transmitting terminals of the RF unit and configured to perform a filtering process for the wireless signal of each frequency band. The transmitter unit further includes a first switch having at least two input terminals and a single output terminal, each input terminal being connected to each transmission filter, the first switch configured to perform a switching operation to connect one of the input terminals and the output terminal in response to a control signal. The transmitter unit also includes a power amplifier configured to amplify the wireless signal transmitted through the output terminal of the first switch. The transmitter unit further includes a second switch having a single input terminal and at least two output terminals, the input terminal being connected to the power amplifier, each output terminal corresponding to each transmission filter, the second switch configured to perform a switching operation to connect the input terminal and one of the output terminals in response to the control signal. The transmitter unit also includes at least two duplexers each being connected to each of the output terminals of the second switch. The transmitter unit further includes an antenna configured to transmit the wireless signal outputted through one of the duplexers, and a control unit configured to generate the control signal.

Aspects of the present invention may minimize the number of the power amplifiers used for the transmitter apparatus of the mobile device. This may secure space for accommodating components and simplify the circuitry of the transmitter apparatus. Also, since relatively high-priced power amplifiers are minimized in number, total production cost of the mobile device may be reduced.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION OF THE INVENTION

Figure 1:
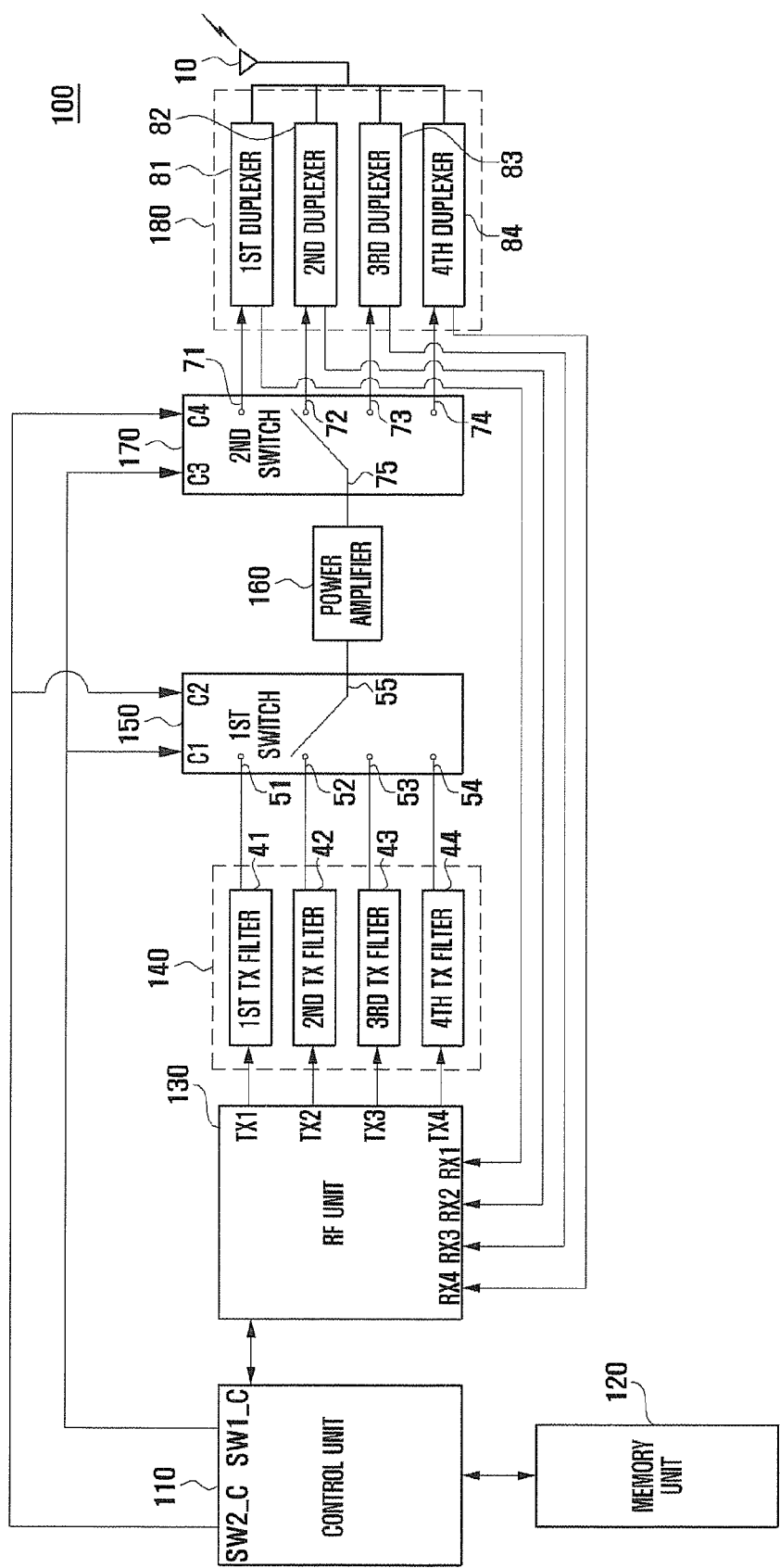
FIG. 1 illustrates a configuration of a mobile device in accordance with an embodiment of the present invention.
Figure 2:
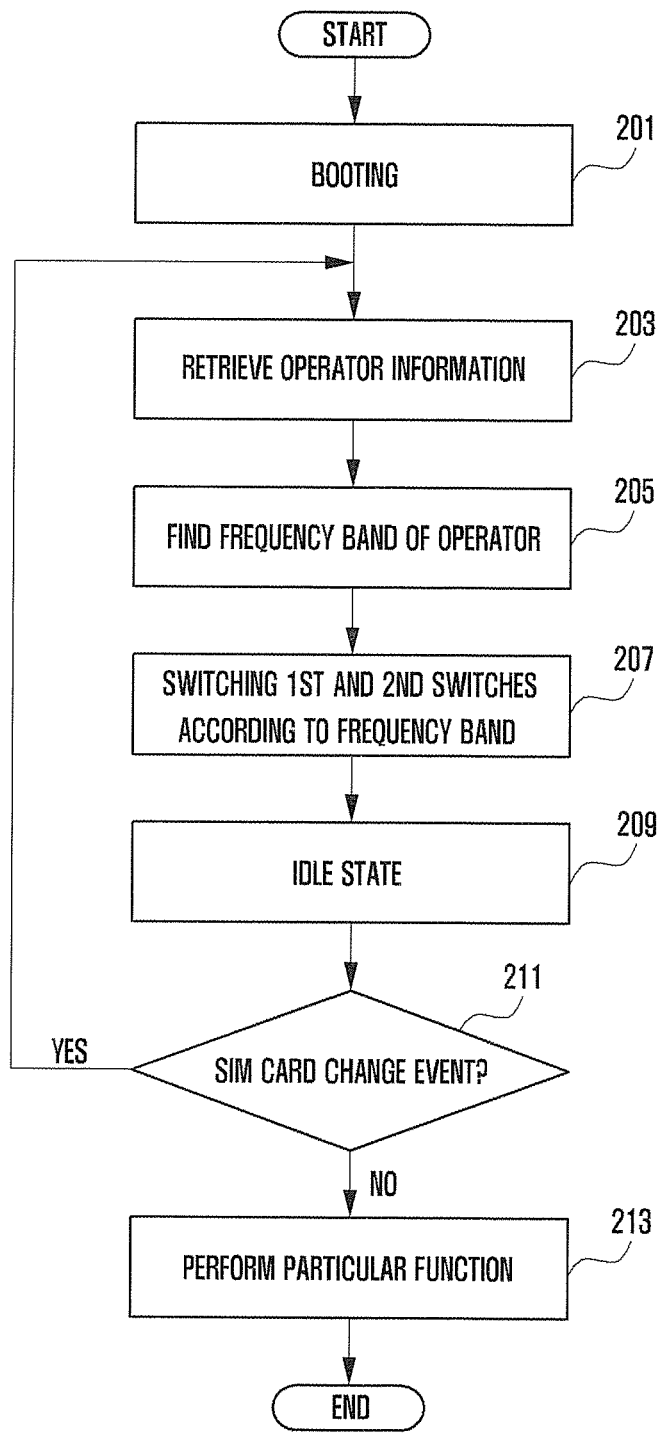
FIG. 2 illustrates a method for operating a transmitter apparatus of a mobile device in accordance with one embodiment of the present invention.
Figure 3:
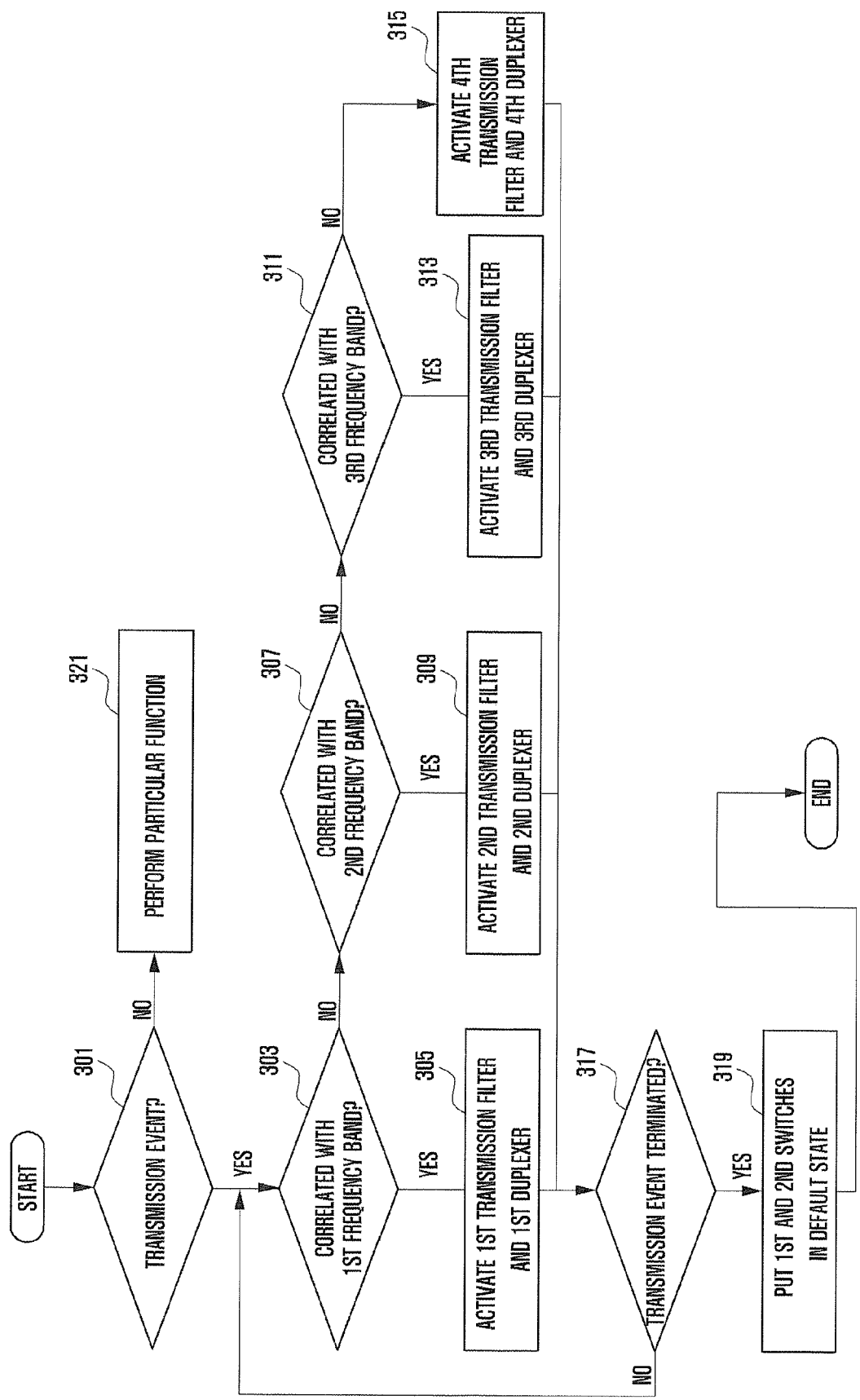
FIG. 3 illustrates a method for operating a transmitter apparatus of a mobile device in accordance with another embodiment of the present invention.

FIGS. 1 through 3, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

Furthermore, well known or widely used techniques, elements, structures, and processes may not be described or illustrated in detail to avoid obscuring the essence of the present invention. Although the drawings represent exemplary embodiments of the invention, the drawings are not necessarily to scale and certain features may be exaggerated or omitted in order to better illustrate and explain the present invention.

A mobile device according to embodiments of this invention may include, but is not limited to, an electronic device supporting a multi-band and includes a mobile communication terminal, a personal digital assistant (PDA), a smart phone, and the like. Embodiments of this invention to be described hereinafter employ a mobile communication terminal as a good representative of the mobile device.

FIG. 1 is a block diagram illustrating the configuration of a mobile device in accordance with an embodiment of the present invention.

Referring to FIG. 1, the mobile device 100 includes an antenna 10, a transmission/reception (TX/RX) isolation unit 180, a first switch 150, a power amplifier 160, a second switch 170, a transmission filter unit 140, a radio frequency (RF) unit 130, a memory unit 120, and control unit 110. The TX/RX isolation unit 180 includes a plurality of duplexers, and the transmission filter unit 140 includes a plurality of transmission filters.

The mobile device 100 having the above elements performs switching operations for the first switch 150 disposed between the transmission filters and the power amplifier 160 and for the second switch 170 disposed between the power amplifier 160 and the duplexers, depending on a frequency band. Therefore, the mobile device 100 can transmit a wireless signal through the transmission filter and duplexer selected in accordance with a specific frequency band. Hereinafter, the mobile device 100 that supports four frequency bands will be described.

The RF unit 130 may establish a communication channel for a voice call and also establish a communication channel for transmission of data such as images. For instance, the RF unit 130 may establish a voice call channel, a data transmission channel, and a video call channel with a base station. The RF unit 130 may include an RF transmitter that up-converts the frequency of a signal and an RF receiver that amplifies with low-noise a received signal and down-converts the frequency of the signal.

The RF unit 130 can transmit and receive a wireless signal at two or more different frequency bands. For this, the RF unit 130 may include at least two transmitting terminals and at least two receiving terminals. For instance, as shown, the RF unit 130 may include four transmitting terminals TX1, TX2, TX3, and TX4 and four receiving terminals RX1, RX2, RX3, and RX4. The RF unit 130 may transmit a wireless signal through a selected one of four transmitting terminals under the control of the control unit 110. Specifically, the first transmitting terminal TX1 sends a wireless signal at the first frequency band, and the second transmitting terminal TX2 sends a wireless signal at the second frequency band. Similarly, the third transmitting terminal TX3 sends a wireless signal at the third frequency band, and the fourth transmitting terminal TX4 sends a wireless signal at the fourth frequency band. Also, the first receiving terminal RX1 receives a wireless signal at the first frequency band, the second receiving terminal RX2 receives a wireless signal at the second frequency band, the third receiving terminal RX3 receives a wireless signal at the third frequency band, and the fourth receiving terminal RX4 receives a wireless signal at the fourth frequency band. For instance, the first frequency band may be the LTE Band 12, the second frequency band may be the LTE Band 13, the third frequency band may be the LTE Band 14, and the fourth frequency band may be the LTE Band 17.

The RF unit 130 does not necessarily include four transmitting terminals and four receiving terminals. If the mobile device 100 merely supports two frequency bands, the RF unit 130 may include two transmitting terminals and two receiving terminals only. Namely, the number of transmitting or receiving terminals may be varied according to the number of LTE bands supported by the mobile device 100.

The transmission filter unit 140 is a device that performs a filtering process for a wireless signal transmitted from the RF unit 130. The transmission filter unit 140 may include at least two transmission filters, depending on the number of frequency bands supported by the mobile device 100. For instance, as shown, the transmission filter unit 140 may have the first transmission filter 41 connected at one end thereof to the first transmitting terminal TX1 of the RF unit 130, the second transmission filter 42 connected at one end thereof to the second transmitting terminal TX2 of the RF unit 130, the third transmission filter 43 connected at one end thereof to the third transmitting terminal TX3 of the RF unit 130, and the fourth transmission filter 44 connected at one end thereof to the fourth transmitting terminal TX4 of the RF unit 130. The first transmission filter 41 performs a filtering process for a signal being transmitted at the first frequency band, and the second transmission filter 42 performs a filtering process for a signal being transmitted at the second frequency band. Similarly, the third transmission filter 43 performs a signal filtering process at the third frequency band, and the fourth transmission filter 44 performs a signal filtering process at the fourth frequency band. These transmission filters 41 to 44 may be formed of SAW (surface acoustic wave) filters. Each of the transmission filters 41 to 44 may be connected at the other end thereof to a corresponding one of input terminals 51 to 54 of the first switch 150.

The first switch 150 may include a plurality of input terminals, a single output terminal, and one or more control terminals. For instance, as shown, the first switch 150 may have the first input terminal 51 connected to the first transmitting filter 41, the second input terminal 52 connected to the second transmission filter 42, the third input terminal 53 connected to the third transmitting filter 43, the fourth input terminal 54 connected to the fourth transmitting filter 44, a single output terminal 55 connected to the power amplifier 160, and two control terminals C1 and C2 through which a control signal for controlling a switching operation of the first switch 150 is inputted.

In response to the control signal of the control unit 110, the first switch 150 performs a switching operation such that one of the transmission filters 41 to 44 may be connected to the power amplifier 160. For instance, if a control signal (0, 0) is inputted to the first and second control terminals C1 and C2, the first switch 150 connects the first transmission filter 41 and the power amplifier 160. If a control signal (0, 1) is inputted, the first switch 150 connects the second transmission filter 42 and the power amplifier 160. If a control signal (1, 0) is inputted, the first switch 150 connects the third transmission filter 43 and the power amplifier 160. If a control signal (1, 1) is inputted, the first switch 150 connects the fourth transmission filter 44 and the power amplifier 160.

The number of the input terminals and control terminals of the first switch 150 may be varied according to the number of frequency bands supported by the mobile device 100. For instance, if the mobile device 100 supports two different frequency bands, the first switch 150 may include two input terminals and a single control terminal. If the mobile device 100 supports eight different frequency bands, the first switch 150 may include eight input terminals and three control terminals.

The power amplifier 160 is a device for increasing the power of a signal transmitted from the RF unit 130 such that the signal can be sent as far as a base station. Since the power amplifier 160 is well known in the art, it may not be described or illustrated in detail herein. Particularly, the power amplifier 160 of this invention can be used in common at two or more different frequency bands supported by the mobile device 100. The power amplifier 160 is connected at one end thereof to the output terminal 55 of the first switch 150 and connected at the other end thereof to an input terminal 75 of the second switch 170. Namely, under the control of the control unit 110, the power amplifier 160 amplifies the power of a signal transmitted through one of the first to fourth transmission filters 41 to 44 and then delivers the amplified signal to the second switch 170.

The second switch 170 may include a single input terminal, a plurality of output terminals, and one or more control terminals. For instance, as shown, the second switch 170 may have the first output terminal 71 connected to the first duplexer 81, the second output terminal 72 connected to the second duplexer 82, the third output terminal 73 connected to the third duplexer 83, the fourth output terminal 74 connected to the fourth duplexer 84, a single input terminal 75 connected to the power amplifier 160, and two control terminals C3 and C4 through which a control signal for controlling a switching operation of the second switch 170 is inputted.

In response to the control signal of the control unit 110, the second switch 170 performs a switching operation such that one of the duplexers 81 to 84 may be connected to the power amplifier 160. For instance, if a control signal (0, 0) is inputted to the first and second control terminals C3 and C4, the second switch 170 connects the first duplexer 81 and the power amplifier 160. If a control signal (0, 1) is inputted, the second switch 170 connects the second duplexer 82 and the power amplifier 160. If a control signal (1, 0) is inputted, the second switch 170 connects the third duplexer 83 and the power amplifier 160. If a control signal (1, 1) is inputted, the second switch 170 connects the fourth duplexer 84 and the power amplifier 160.

The number of the output terminals and control terminals of the second switch 170 may be varied according to the number of frequency bands supported by the mobile device 100.

The TX/RX isolation unit 180 is a device that separates a transmitted signal and a received signal. The TX/RX isolation unit 180 may be formed of a duplexer. The TX/RX isolation unit 180 may include at least two duplexers, depending on the number of frequency bands supported by the mobile device 100. For instance, the TX/RX isolation unit 180 may have a first duplexer 81 that is connected to the first output terminal 71 of the second switch 170 and divides a wireless signal of the first frequency band into a transmitted signal and a received signal; a second duplexer 82 that is connected to the second output terminal 72 of the second switch 170 and divides a wireless signal of the second frequency band into a transmitted signal and a received signal; a third duplexer 83 that is connected to the third output terminal 73 of the second switch 170 and divides a wireless signal of the third frequency band into a transmitted signal and a received signal; and a fourth duplexer 84 that is connected to the fourth output terminal 74 of the second switch 170 and divides a wireless signal of the fourth frequency band into a transmitted signal and a received signal. Received signals divided through the first to fourth duplexers 81 to 84 are inputted to the first to fourth receiving terminals RX1 to RX4 of the RF unit 130, respectively.

The antenna 10 is a device for transmitting and receiving a wireless signal. Particularly, the antenna 10 is a wideband antenna capable of transmitting and receiving a wireless signal of two or more different frequency bands. For instance, the antenna 10 may transmit and receive a wireless signal of at least two different frequency bands used for offering LTE services. Specifically, the antenna 10 may transmit and receive wireless signals corresponding to the LTE Bands 12, 13, 14 and 17 in a 700 MHz band.

The memory unit 120 stores an operating system (OS) of the mobile device 100, various applications associated with optional functions such as a sound output, an image view, a video play, a broadcast signal output, and the like, and related user data. Particularly, the memory unit 120 of this invention may store a control program that retrieves operator information contained in a subscriber identity module (SIM) card (not shown) in a booting process or when an SIM card change event occurs, and then controls the first and second switches 150 and 170 such that a wireless signal may be transmitted through a specific transmission filter and duplexer selected in response to a specific frequency band of a current network operator. Additionally, if the mobile device 100 has two or more SIM cards, the control program may find a specific SIM card corresponding to the transmission event when any transmission event occurs, and then control a transmission of a wireless signal to use a specific transmission filter and duplexer selected in response to the specific SIM card.

The control unit 110 performs a function to control the whole operation of the mobile device 100 and signal flows among internal blocks of the mobile device 100, and also performs a function to process data transmitted or received through the RF unit 130. Particularly, the control unit 110 of this invention may retrieve operator information contained in the SIM card in a booting process of the mobile device 100 and then control the first and second switches 150 and 170 such that a specific transmission filter and duplexer corresponding to a specific frequency band of a current network operator may be connected to the power amplifier 160. Similarly, when the SIM card change event occurs, the control unit 110 may retrieve operator information contained in a new SIM card and then control the first and second switches 150 and 170 such that a specific transmission filter and duplexer corresponding to the retrieved operator information may be connected to the power amplifier 160.

If the mobile device 100 has two or more SIM cards, the control unit 110 may retrieve operator information from a master SIM card in a booting process and then control the first and second switches 150 and 170 such that a specific transmission filter and duplexer corresponding to a specific frequency band of a current network operator may be connected to the power amplifier 160. Thereafter, when any transmission event occurs, the control unit 110 may find a specific SIM card corresponding to the transmission event and then control the first and second switches 150 and 170 such that a specific transmission filter and duplexer corresponding to the specific SIM card may be connected to the power amplifier 160. When the transmission event is terminated, the control unit 110 may put the first and second switches 150 and 170 in a predetermined default state. For instance, in response to the termination of the transmission event, the control unit 110 may control the first and second switches 150 and 170 such that a specific transmission filter and duplexer corresponding to the master SIM card may be connected to the power amplifier 160.

In order to control switching operations of the first and second switches 150 and 170, the control unit 110 has the first control terminal SW1_C and the second control terminal SW2_C therein. These control terminals SW1_C and SW2_C may be GPIO (general purpose input output) terminals. The number of control terminals SW_C may be varied according to the number of frequency bands supported by the mobile device 100. For instance, if the mobile device 100 supports frequency bands from five to eight, the number of the control terminals is three.

The control unit 110 may simultaneously control switching operations of the first and second switches 150 and 170 through the control terminals SW1_C and SW2_C. Alternatively, the control unit 110 may control both switches 150 and 170 through a single control terminal or separately control the switches 150 and 170 through respective control terminals. Although FIG. 1 depicts the first and second switches 150 and 170 and the power amplifier 160 as separate elements, at least two of them may be integrated into a single module.

Although not illustrated, the mobile device 100 of this invention may essentially or selectively include any other elements such as a display unit, a input unit, a camera module, a short range communication module, a location based service module, a broadcast receiving module, a digital sound play module such as an MP3 module, an Internet access module, and the like. According to a digital convergence tendency today, such elements may be varied, modified and improved in various ways, and any other elements equivalent to the above elements may be additionally or alternatively equipped in the mobile device 100. As will be understood by those skilled in the art, some of the above-mentioned elements in the mobile device may be omitted or replaced with another.

FIG. 2 is a flow diagram illustrating a method for operating a transmitter apparatus of a mobile device in accordance with an embodiment of the present invention.

Referring to FIGS. 1 and 2, the mobile device 100 may perform a booting process (block 201). This booting process may start when a given power key is merely selected or when such a power key is pressed for a given time.

Then the control unit 110 may retrieve operator information contained in the SIM card (block 203) and then find a specific frequency band of a current network operator (block 205). For the above, the memory unit 120 or the SIM card may store information about a service frequency band of each individual network operator.

Next, the control unit 110 may control a switching operation of the first and second switches 150 and 170 according to the specific frequency band (block 207). For instance, if a current operator offers a service at the first frequency band (e.g., the LTE Band 12), the control unit 110 may enable the first switch 150 to connect the first transmission filter 41 and the power amplifier 160 and also enable the second switch 170 to connect the first duplexer 81 and the power amplifier 160. Similarly, if a current operator offers a service at the second frequency band (e.g., the LTE Band 13), the control unit 110 may enable the first switch 150 to connect the second transmission filter 42 and the power amplifier 160 and also enable the second switch 170 to connect the second duplexer 82 and the power amplifier 160. If a current operator offers a service at the third frequency band (e.g., the LTE Band 14), the control unit 110 may enable the first switch 150 to connect the third transmission filter 43 and the power amplifier 160 and also enable the second switch 170 to connect the third duplexer 83 and the power amplifier 160. If a current operator offers a service at the fourth frequency band (e.g., the LTE Band 17), the control unit 110 may enable the first switch 150 to connect the fourth transmission filter 44 and the power amplifier 160 and also enable the second switch 170 to connect the fourth duplexer 84 and the power amplifier 160.

After the booting process is completed, the control unit 110 may enter into an idle state (block 209). Then the control unit 110 may determine whether any SIM card change event occurs (block 211). If so, the control unit 110 may return to the above block 203. Namely, the control unit 110 may retrieve operator information from a new SIM card and then control the first and second switches 150 and 170 such that a specific transmission filter and duplexer corresponding to the retrieved operator information may be connected to the power amplifier 160. However, if there is no SIM card change event, the control unit 110 may perform any other particular function (block 213). For instance, the control unit 110 may perform a music player function, a camera function, and the like, at a user's request or may keep in an idle state.

The embodiment described above is associated with a mobile device that includes only one SIM card. Hereinafter, it will be supposed that the mobile device has two or more SIM cards.

FIG. 3 is a flow diagram illustrating a method for operating a transmitter apparatus of a mobile device in accordance with another embodiment of the present invention.

The mobile device 100 to be described hereinafter is in a state after a given booting process is completed. In this state, the power amplifier in the mobile device 100 is connected to a specific transmission filter and duplexer corresponding to a master one of all the SIM cards. This state will be referred to as a default state.

Referring to FIGS. 1 and 3, the control unit 110 may determine whether any transmission event occurs (block 301). If there is no transmission event, the control unit 110 may perform any particular function (block 321). For instance, the control unit 110 may perform a music player function, a camera function, and the like, at a user's request or may keep in an idle state. If any transmission event occurs, the control unit 110 may further determine whether the transmission event correlates to the first frequency band (block 303). Normally when a signal of a transmission request is inputted, the mobile device 100 having two or more SIM cards may display a window that allows a user to select one of the SIM cards for the transmission event. Then the control unit 110 may find a specific frequency band correlated with the transmission event, depending on the result of selection.

If the transmission event correlates with the first frequency band, the control unit 110 may activate the first transmission filter 41 and the first duplexer 81 (block 305). Namely, the control unit 110 may enable the first switch 150 to connect the first transmission filter 41 and one end of the power amplifier 160 and also enable the second switch 170 to connect the first duplexer 81 and the other end of the power amplifier 160.

If the transmission event does not correlate with the first frequency band, the control unit 110 may further determine whether the transmission event correlates to the second frequency band (block 307). If the transmission event correlates with the second frequency band, the control unit 110 may activate the second transmission filter 42 and the second duplexer 82 (block 309). Namely, the control unit 110 may enable the first switch 150 to connect the second transmission filter 42 and one end of the power amplifier 160 and also enable the second switch 170 to connect the second duplexer 82 and the other end of the power amplifier 160.

If the transmission event does not correlate with the second frequency band, the control unit 110 may further determine whether the transmission event correlates to the third frequency band (block 311). If the transmission event correlates with the third frequency band, the control unit 110 may activate the third transmission filter 43 and the third duplexer 83 (block 313). Namely, the control unit 110 may enable the first switch 150 to connect the third transmission filter 43 and one end of the power amplifier 160 and also enable the second switch 170 to connect the third duplexer 83 and the other end of the power amplifier 160. If the transmission event does not correlate with the third frequency band, the control unit 110 may activate the fourth transmission filter 44 and the fourth duplexer 84 (block 315). Namely, the control unit 110 may enable the first switch 150 to connect the fourth transmission filter 44 and one end of the power amplifier 160 and also enable the second switch 170 to connect the fourth duplexer 84 and the other end of the power amplifier 160.

Next, the control unit 110 may determine whether the transmission event is terminated (block 317). If the transmission event is not terminated yet, the control unit 110 returns to the above block 303. If the transmission event is terminated, the control unit 110 may put the first and second switches 150 and 170 in a default state (block 319). As discussed above, in the default state, a specific transmission filter and duplexer corresponding to a master SIM card are connected to the power amplifier 160.

Although the disclosure set forth herein describes a specific embodiment where four frequency bands are used for services, this is exemplary only and not to be considered as a limitation of the present invention. This invention may be favorably applied to other embodiments where two or more frequency bands are used for services.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A transmitter apparatus of a mobile device, the transmitter apparatus comprising:
a radio frequency (RF) unit having at least two transmitting terminals configured to send wireless signals of different frequency bands;
at least two transmission filters each being connected to each of the transmitting terminals of the RF unit and configured to perform a filtering process for the wireless signal of each frequency band;
a first switch having at least two input terminals and a single output terminal, each input terminal being connected to each transmission filter, the first switch configured to perform a switching operation to connect one of the input terminals and the output terminal in response to a control signal;
a power amplifier configured to amplify the wireless signal transmitted through the output terminal of the first switch;
a second switch having a single input terminal and at least two output terminals, the input terminal being connected to the power amplifier, each output terminal corresponding to each transmission filter, the second switch configured to perform a switching operation to connect the input terminal and one of the output terminals in response to the control signal;

at least two duplexers each being connected to each of the output terminals of the second switch;
an antenna configured to transmit the wireless signal outputted through one of the duplexers; and
a control unit configured to generate the control signal, wherein the mobile device comprises at least two subscriber identity module (SIM) cards and wherein the control unit is configured to determine the SIM card correlated with a transmission event when the transmission event occurs, and then to control the first and second switches such that the transmission filter and the duplexer selected corresponding to the SIM card are connected to the power amplifier.

2. The transmitter apparatus of claim 1, wherein the control unit is further configured to retrieve operator information contained in a subscriber identity module (SIM) card in a booting process and then to control the first and second switches such that the transmission filter and the duplexer selected corresponding to a specific frequency band of a current network operator are connected to the power amplifier.

3. The transmitter apparatus of claim 1, wherein the first and second switches are simultaneously controlled by means of the same control signal.

4. The transmitter apparatus of claim 1, wherein the control unit is further configured to put the first and second switches in a predetermined default state when the transmission event is terminated.

5. A method for operating a transmitter apparatus of a mobile device that includes a first switch having a single output terminal and at least two input terminals connected respectively to at least two transmission filters, a second switch having a single input terminal and at least two output terminals connected respectively to at least two duplexers, and disposed between the output terminal of the first switch and the input terminal of the second switch, the method comprising:
controlling a switching operation of the first switch such that the power amplifier is connected to the transmission filter selected corresponding to a specific frequency band;
controlling a switching operation of the second switch such that the power amplifier is connected to the duplexer selected corresponding to the specific frequency band; and
if the mobile device comprises at least two subscriber identity module (SIM) cards, determining the specific frequency band of the SIM card correlated with a transmission event when the transmission event occurs, in order to control the switching operation of the first and second switches.

6. The method of claim 5, further comprising:
retrieving operator information contained in a subscriber identity module (SIM) card of the mobile device in a booting process and then determining the specific frequency band of a current network operator in order to control the switching operation of the first and second switches.

7. The method of claim 5, further comprising:
putting the first and second switches in a predetermined default state when the transmission event is terminated.

8. The method of claim 5, wherein the first and second switches are simultaneously controlled by means of a same control signal.

9. The method of claim 7, wherein the transmission filter and the duplexer corresponding to a master SIM card of the SIM cards are connected to the power amplifier in the default state.

10. A mobile device comprising:
a display unit;
an input unit; and
a transmitter unit, the transmitter unit comprising:
a radio frequency (RF) unit having at least two transmitting terminals configured to send wireless signals of different frequency bands;
at least two transmission filters each being connected to one of the transmitting terminals of the RF unit and configured to perform a filtering process for the wireless signal of each frequency band;
a first switch having at least two input terminals and a single output terminal, each input terminal being connected to each transmission filter, the first switch configured to perform a switching operation to connect one of the input terminals and the output terminal in response to a control signal;
a power amplifier configured to amplify the wireless signal transmitted through the output terminal of the first switch;
a second switch having a single input terminal and at least two output terminals, the input terminal being connected to the power amplifier, each output terminal corresponding to each transmission filter, the second switch configured to perform a switching operation to connect the input terminal and one of the output terminals in response to the control signal;
at least two duplexers each being connected to each of the output terminals of the second switch;
an antenna configured to transmit the wireless signal outputted through one of the duplexers; and
a control unit configured to generate the control signal, wherein the mobile device comprises at least two subscriber identity module (SIM) cards and wherein the control unit is further configured to determine the SIM card correlated with a transmission event when the transmission event occurs, and then to control the first and second switches such that the transmission filter and the duplexer selected corresponding to the SIM card are connected to the power amplifier.

11. The mobile device of claim 10, wherein the control unit is further configured to retrieve operator information contained in a subscriber identity module (SIM) card in a booting process and then to control the first and second switches such that the transmission filter and the duplexer selected corresponding to a specific frequency band of a current network operator are connected to the power amplifier.

12. The mobile device of claim 10, wherein the first and second switches are simultaneously controlled by means of the same control signal.

13. The mobile device of claim 10, wherein the control unit is further configured to put the rust and second switches in a predetermined default state when the transmission event is terminated.

14. The mobile device of claim 10, further comprising:
a memory unit configured to store an operating system (OS) of the mobile device.

15. The mobile device of claim 10, wherein the at least two duplexers comprise four duplexers.

\* \* \* \* \*